US005917202A

United States Patent [19]
Haitz et al.

[11] Patent Number: 5,917,202
[45] Date of Patent: *Jun. 29, 1999

[54] HIGHLY REFLECTIVE CONTACTS FOR LIGHT EMITTING SEMICONDUCTOR DEVICES

[75] Inventors: Roland H. Haitz, Portola Valley; Fred A. Kish, Jr., San Jose, both of Calif.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/576,251
[22] Filed: Dec. 21, 1995
[51] Int. Cl.$^6$ ............................................. H01L 33/00
[52] U.S. Cl. ............................ 257/98; 257/99; 438/662
[58] Field of Search ........................ 257/98–99; 438/604, 438/605, 662, 666, 26

[56] References Cited

U.S. PATENT DOCUMENTS

| 3,790,868 | 2/1974 | Soshea ........................................ 257/98 |
| 3,877,052 | 4/1975 | Dixon et al. ............................... 257/98 |
| 3,909,929 | 10/1975 | Debesis ..................................... 438/26 |
| 4,232,440 | 11/1980 | Bastek ....................................... 438/26 |

FOREIGN PATENT DOCUMENTS

| 52-37783 | 3/1977 | Japan ......................................... 257/98 |

OTHER PUBLICATIONS

Sze, "Physics of Semiconductor Devices," 1981, pp. 64–65 and 304–307.
K. L. Chopra, "Thin Film Phenomena" McGraw–Hill, Inc. 1969, p. 744.
F. A. Kish, et al., "Very High–Efficiency Semiconductor Wafer–Bonded Transparent–Substrate (AlxGa1–x)0.5In0.5P/GaP Light–Emitting Diodes," Appl. Phys. Lett., vol. 64, May 23, 1994, pp. 2839–2841.

*Primary Examiner*—John Guay
*Attorney, Agent, or Firm*—Pamela Lau Kee

[57] ABSTRACT

Light emitting diodes with highly reflective contacts and methods for fabricating them are described. In a first preferred embodiment of the present invention, LEDs with reflective contacts are formed using a laser to create small alloyed dots in a highly reflective metal evaporated on the top and bottom surface of the LED chip. Using this technique, most of the bottom surface remains highly reflective, and only those portions of the bottom surface where the laser struck become absorbing. Typically, only 1% of the bottom surface is formed into contacts, leaving 99% of the bottom surface to serve as a reflecting surface. The 1% of the surface, however, provides an adequate low resistance ohmic contact. LEDs fabricated with this technique allow photons to bounce off the rear surface more than 20 times before there is a 50% chance of absorption. In a second embodiment of the present invention, an application of compound semiconductor wafer bonding techniques permits the fabrication of LEDs with a plurality of these small, micro-alloyed contacts without the use of a laser.

6 Claims, 4 Drawing Sheets

HIGHLY REFLECTIVE CONTACTS FOR LIGHT EMITTING SEMICONDUCTOR DEVICES

BACKGROUND OF THE INVENTION

This invention is in the field of light emitting semiconductor devices. Light emitting diodes ("LED"s) with highly reflective contacts and methods for making them are the particular subject of this disclosure.

In known LEDs, the extraction efficiency, which is a ratio of the amount of light leaving the finished LED to the amount of light actually generated by the LED, is determined by two competing processes: internal scattering of light into light escape cones within the LED and internal absorption of light within the bulk of the LED or at lossy surfaces.

Due to their high density of free charge carriers, the contacts which allow a voltage to be applied across an LED absorb a great deal of the light generated by the LED. Minimizing the size of the LED's contacts increases the extraction efficiency of the LED, as long as sufficient ohmic surface area is retained. Further, if the contacts can be made reflective, internal reflection of light is increased. This improves the extraction efficiency, as the reflected light will eventually scatter into one of the LED's light escape cones if the absorption coefficient within the LED can be reduced sufficiently to permit 10–100 internal reflections within the LED chip.

Reflecting contacts have been known since the 1970's. Two approaches, dielectric mirrors with contact holes and shadow mask evaporation, are used to fabricate these reflecting contacts. To form a dielectric mirror with contact holes, a $SiO_2$ layer is deposited on the back surface of the LED wafer and small holes with a diameter of 15–25 $\mu$m are etched through the $SiO_2$ layer using photolithography. As the wafers from which the LED chips are fabricated are generally not completely flat, optical resolution with conventional photolithographic techniques limit the hole size to no less than 10–15 $\mu$m in high volume production. Consequently, the contacts typically cover 25% of the LED's back surface, resulting in an area weighted reflectivity of 70–75%. After being reflected twice by the rear contacts, a photon has a 50% chance of being absorbed. FIG. 2 shows an LED using this type of known reflective contact.

To avoid the cost of the $SiO_2$ deposition and subsequent photolithographic steps, a contact metal can be evaporated through a shadow mask to form contacts. The resulting contacts still cover roughly 25% of the LED's back surface and perform similarly to those formed using the dielectric mirror with contact holes.

As both these known techniques offer only marginal improvements in light extraction efficiency, simpler metal contacts covering the entire back surface of the LED are often used.

LEDs with highly reflective but still conductive back contacts and methods for fabricating them are therefore desirable.

SUMMARY OF THE INVENTION

In a first preferred embodiment of the present invention, LEDs with highly reflective contacts are formed using a laser to create small alloyed dots in a highly reflective metal evaporated on the top and bottom surface of the LED chip. Using this technique, most of the bottom surface remains highly reflective, and only those portions of the bottom surface where the laser struck become absorbing. Typically, only 1% of the bottom surface is formed into absorbing, ohmic contacts, leaving 99% of the bottom surface to serve as a reflecting surface. The 1% of the surface, however, provides an adequate low resistance ohmic contact. LEDs fabricated with this technique allow photons to bounce off the rear surface more than 20 times before there is a 50% chance of absorption.

In a second embodiment of the present invention, an application of compound semiconductor wafer bonding techniques permits the fabrication of LEDs with a plurality of these small, micro-alloyed contacts without the use of a laser.

These embodiments will now be described in detail, with reference to the figures listed and described below.

BRIEF DESCRIPTION OF THE ILLUSTRATIONS

Figure 3A:
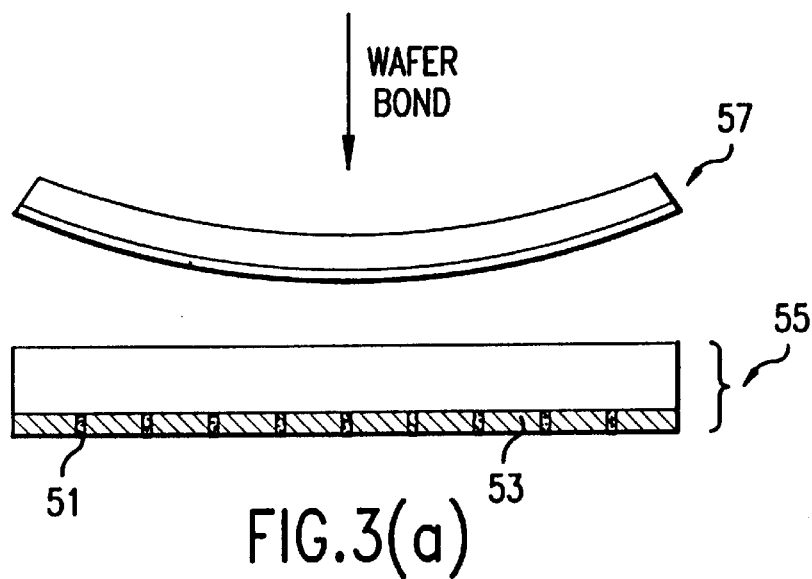
Figure 3B:
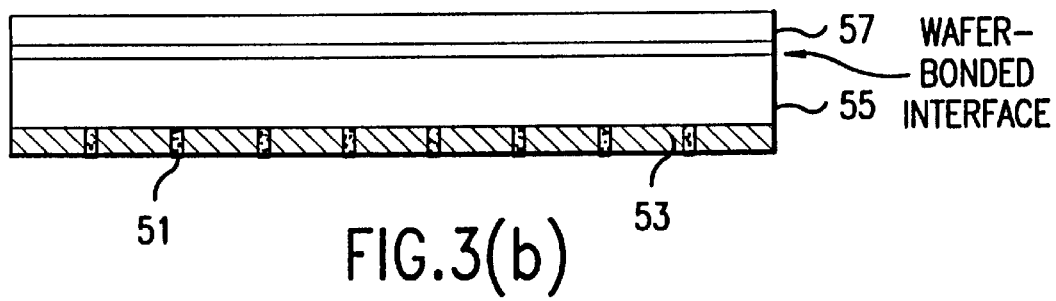
Figure 3C:
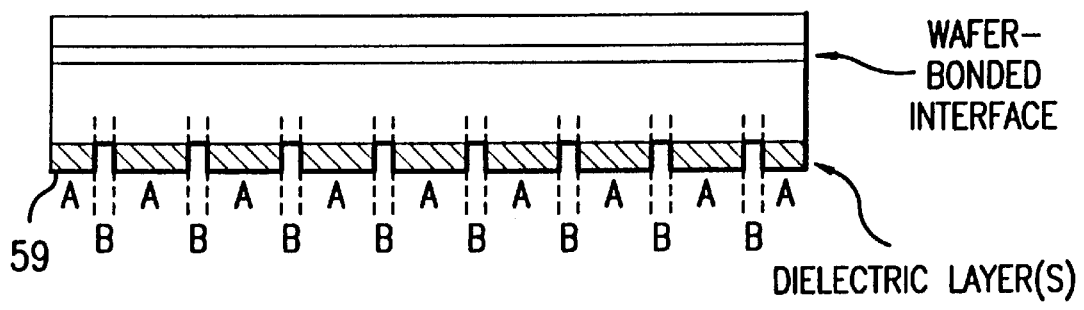
Figure 4:
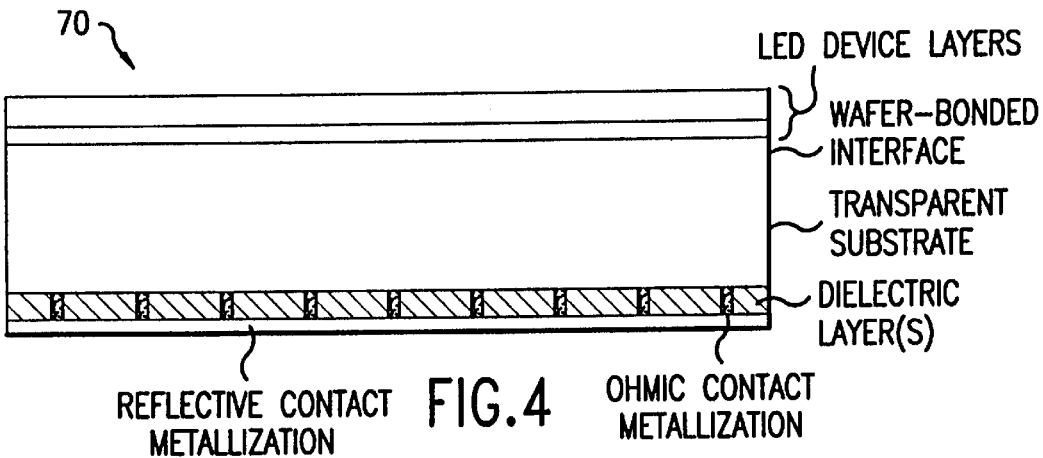
Figure 5:
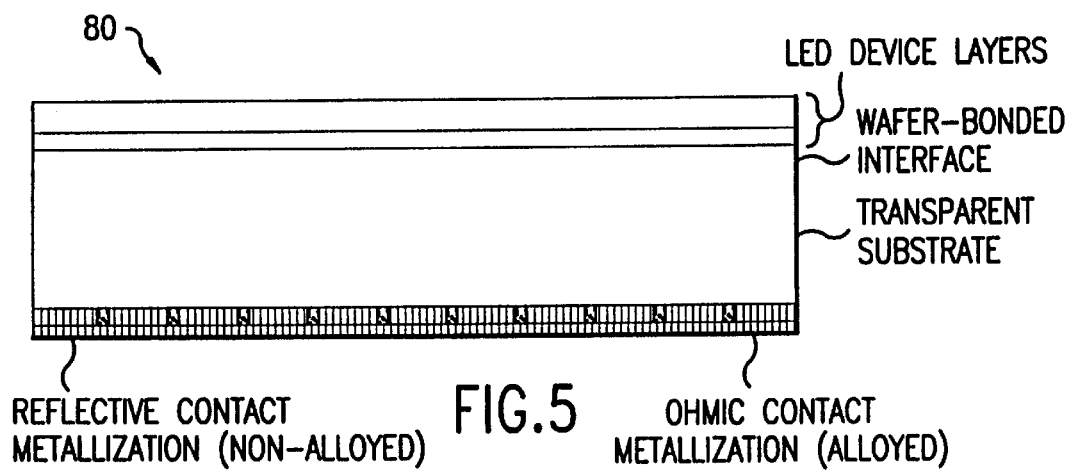

FIGS. 3a, 3b, and 3c illustrate the process needed to fabricate the second embodiment of the present invention;

FIG. 4 illustrates another embodiment of the present invention;

FIG. 5 illustrates yet another embodiment of the present invention; and

Figure 6:
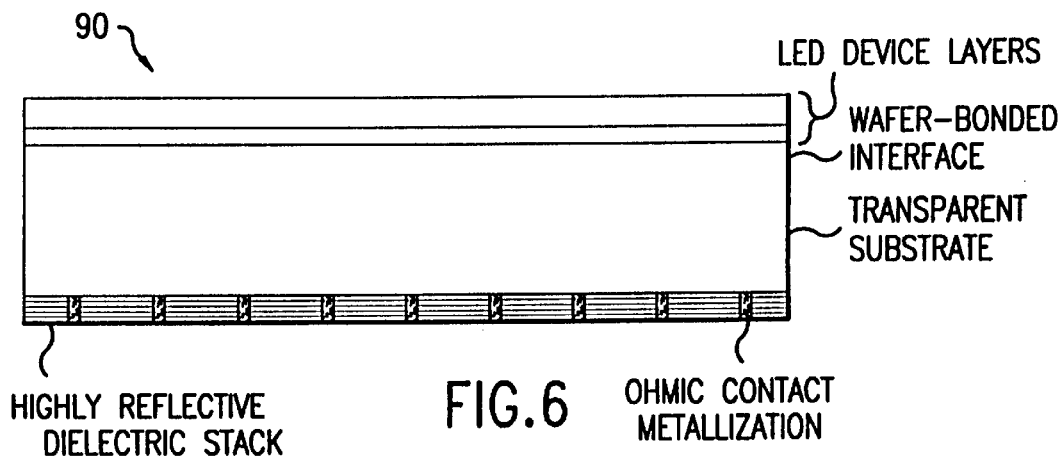

FIG. 6 illustrates still another embodiment of the present invention.

DETAILED DESCRIPTION OF THE PREFERRED EMBODIMENTS

The first embodiment of the present invention comprises a method of fabricating effective contacts on an LED chip without destroying the valuable optical properties offered by reflecting contacts and the LEDs fabricated by using this method. In this first embodiment, a highly reflective metal doped with Zn, Ge or another similar metal that forms ohmic, low resistance contact with p- or n-type GaP is evaporated onto the top and/or bottom surface of an LED wafer. A low resistance ohmic contact to an LED is one which allows the LED to operate with less than 20Ω forward resistance when operated in excess of the diode turn-on voltage. Only small areas on the top and/or bottom surface of the LED are coated with this reflective metal. Instead of alloying the entire wafer in an oven, the wafer is selectively alloyed by heating it with a series of laser pulses. This process forms a grid of small alloyed dots of diameter D a distance L apart.

As an example, a 500×500 $\mu$m LED chip with a dot diameter D of 2 $\mu$m and a dot spacing L of 20 $\mu$m center-to-center has a total of 625 micro-alloyed dots on its bottom surface. The spreading resistance of an individual dot would be characterized as:

$$R_{sp} = \rho/2D.$$

In p-type GaP, $\rho$ is 0.1Ωcm and for n-type GaP, $\rho$ is 0.04Ωcm. All 625 dots in parallel add up to a spreading resistance of 0.4Ω for an n-type back contact. The 2 $\mu$m dots spaced 20 $\mu$m apart result in a contact area ($D^2/L^2$) of 1%.

The general case for the spreading resistance $R_{sp}$ for an LED chip with area A, dot diameter D and a dot spacing L is given by the formula:

$$R_{sp}=[\rho/2D]*[L^2/A]=D*[L^2/D^2]*[\rho/2A].$$

For an LED of given size A, resistivity ρ, and fractional contact area $D^2/L^2$, the spreading resistance decreases with D. The optimum solution is given by the smallest manufacturable diameter of the micro-alloyed dots. If the laser wavelength is less than 1 μm, laser micro-alloyed dots with a diameter D in the 2 μm range are possible.

Figure 1:
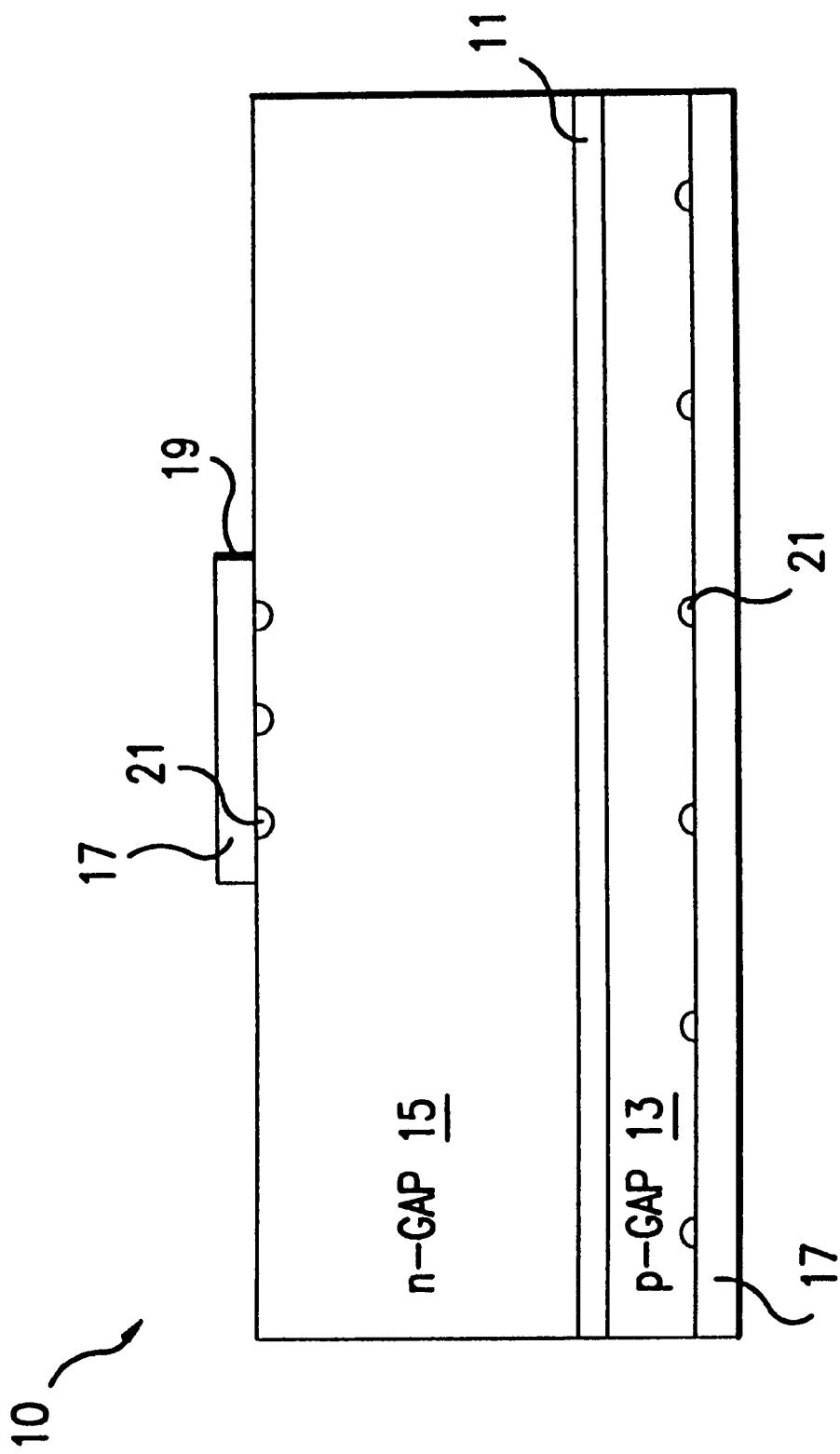
FIG. 1 is a cross section of an LED fabricated according to the first embodiment of the present invention.
Figure 2:
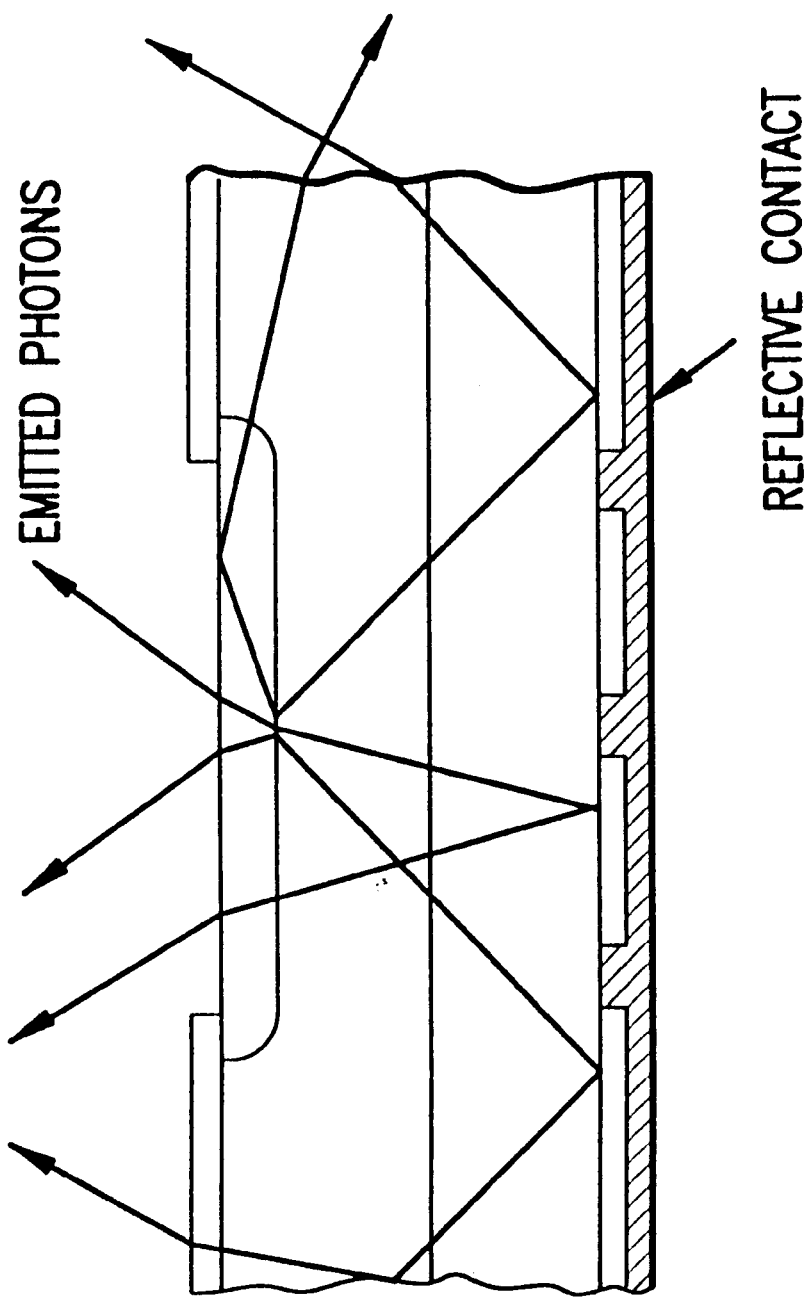
FIG. 2 shows an LED with a known type of reflective contact.

FIG. 1 is a cross-section of an LED fabricated using this first embodiment of the present invention. LED 10 is comprised of active layer 11, lower p-type GaP layer 13, and upper n-type GaP layer 15. Metal layer 17 covers the entire bottom surface of layer 13 and front contact 19 covers a predetermined portion of upper layer 15. Micro-alloyed dots 21 of diameter D are formed on both metal layer 17 and front contact 19.

The choice of metals used for metal layer 17 and front contact 19 is critical. The reflectivity R of the unalloyed metal on a material having an index of refraction $n_1$ equal to 3.0 is given by the formula:

$$R=[(n_1-n_2)^2+k_2^2]/[(n_1+n_2)^2+k_2^2].$$

The best choice for the metal is silver. For silver and yellow light, $n_2=0.05$ and $k_2=3.94$, with R=0.98. The weighted reflectivity for the back surface is then R=97%, which is comprised of a 2% loss on 99% of the unalloyed metal area and a 100% loss on the 1% comprising the micro-alloyed dots. In an LED chip of this design, a photon can bounce off the back surface more than 20 times before there is a 50% chance of photon absorption.

The Ag metal can be AgZn or AgGe, but a preferable arrangement would be a sandwich of Ag for reflectivity, a dopant metal such as Zn or Ge, a solder barrier metal such as W or Mo and a solder contact layer such as Ni.

The micro-alloyed contacts disclosed herein cannot be produced by standard photolithographic techniques as the LED wafer bow limits the resolution to 10–15 μm in high volume production. This limitation can be overcome by using a laser to alloy dots with dimensions on the order of ~1–2 μm. This can be accomplished with a pulsed or continuous wave laser beam with sufficient power that can be deflected to scan the back surface of a wafer. Alternatively, a hologram or diffraction grating(s) could break up the laser beam into a dot pattern of the desired size and spacing. Neither process would require any registration with features on the front of the wafer, such as the top contacts. Furthermore, the laser alloying circumvents the problem of producing micro-alloyed contacts on bowed wafers by virtue of the increased depth of field that can be obtained in the laser alloying process. If the top contacts are to be micro-alloyed, a different dot pattern could be used. Local heating of the un-metallized top GaP layer should not create absorption centers.

One difficulty with the first embodiment of the present invention is the need to develop a practical metal system which can serve simultaneously as an ohmic contact in the laser alloyed regions, a very good reflector in the non-alloyed regions, and which can absorb a high power laser beam. The pattern resulting from the laser alloying must be sufficiently low in the stress it places on the semiconductor so as to adhere well to it, especially in the non-alloyed regions. The use of a laser manufacturing process may also be too expensive in certain applications.

The second embodiment of the present invention provides an alternative means to manufacture the reflective contacts. This second embodiment utilizes both conventional photolithographic techniques employed on flat wafer surfaces and compound semiconductor wafer bonding techniques. Herein, a flat wafer surface is defined as having sufficient surface flatness and absence of bow so as to facilitate the photolithographic patterning of features with dimensions of 1–4 μm over the entire diameter of the wafer with yields exceeding 90%.

Transparent substrate ("TS") AlGaInP/GaP LEDs have been fabricated by removing the original GaAs growth substrate from an GaP/AlGaInP/GaAs epitaxial wafer, and wafer bonding a GaP substrate to the AlGaInP epitaxial layers, resulting in a GaP/AlGaInP/GaP wafer. By combining wafer bonding and photolithographic techniques, an LED with "micro-alloyed" contacts can be fabricated.

The process of fabricating an LED with micro-alloyed contacts using the second embodiment of the present invention is shown in FIGS. 3a, 3b, and 3c. Using known photolithographic techniques, small openings 51 of about 1–10 μm in diameter and roughly 5–100 μm apart are patterned on a dielectric film 53 on a flat, transparent substrate 55. Next, using techniques described by F. A. Kish, et al., "Very High Efficiency Semiconductor Wafer-Bonded Transparent Substrate AlGaInP/GaP Light Emitting Diodes," Appl. Phys. Lett., V. 64, 2839–2841 (May 23, 1994), the transparent substrate is wafer bonded to the LED active layers 57 (FIG. 3b). Next, ohmic contact metallizations 59 are deposited over the entire surface of the patterned dielectric and then alloyed into the ohmic contact areas (FIG. 3c). One possible material system is AlGaInP active LED layers, a GaP transparent substrate, and either Au—Ge—Ag for an n-type contact or Au—Zn—Ag for a p-type contact.

If the ohmic contact metallization possesses the appropriate reflectivity in the reflective contact areas, the LED is complete at this point. If the reflectivity is insufficient or if the mechanical integrity of the metallization is insufficient, then the non-alloyed metallization can be removed selectively from the reflective areas using various etching techniques. The dielectric masking material may also be removed. A final deposition of reflective material would then be made over the reflective contact areas. This reflective material may consist of metals, a dielectric/metal stack, or a dielectric stack. LED 70, shown in FIG. 4, is an example of a device wherein the reflective contact pattern areas comprise a dielectric and a different metallization than the ohmic contact areas.

If the reflective layer consists of conductive metallic layers, such layers may be deposited over the entire microalloy structure. The reflective layer may also consist of a stack of dielectric layers which would require deposition in only the reflective areas.

The transparent substrate should be polished on both sides before any other processing step. Such polishing is required for wafer bonding and provides a smooth surface to improve the optical reflectivity in the reflective contact areas.

Wafer bonding typically occurs at high temperature and significant decomposition of the exposed semiconductor surfaces can occur. It may be desirable to protect the entire micro-alloy structure by depositing one type of dielectric (e.g., $Si_3N_4$) in the ohmic contact regions, to prevent decomposition, and a second type of dielectric (e.g., $SiO_2$) in the reflective contact areas prior to wafer bonding. After wafer bonding is complete, the dielectric in the ohmic contact areas can be selectively removed prior to deposition of an ohmic contact metallization (e.g., by plasma etching). If no protective dielectric layer is employed in the ohmic contact areas, it may be necessary to etch the top surface layer of the semiconductor in these areas to remove any surface damage that may have occurred during the wafer bonding process.

If the dielectric that is used to mask the reflective contact areas is used as part of the reflector, this dielectric should be deposited to form an optically smooth layer. Such a layer can be deposited by electron beam deposition. Prior to alloying, the ohmic contact metallization may be patterned by lift-off techniques, resulting in only metal layers present in the ohmic contact areas during the alloying step.

FIG. 5 shows LED 80 wherein the reflective contact pattern areas comprise a non-alloyed metallization that also covers the ohmic contact areas alloyed metallization, each metallization potentially being different.

FIG. 6 illustrates LED 90 wherein the reflective contact areas comprise a highly reflective dielectric stack.

In both embodiments of this invention, the micro-alloyed areas may be of any shape (e.g., ellipses, squares, annular rings, etc.). They are not limited to having a circular shape. However, the area coverage of these micro-alloyed regions should be <10% of the total contact area, the contact area consisting of the micro-alloyed and highly reflective regions.

What is claimed is:

1. A reflective contact for a light emitting semiconductor device, the light emitting semiconductor device having a top and bottom surface, the reflective contact comprising:

a reflective metal layer adjacent and abutting a predetermined portion of at least one of the top and bottom surface of the light emitting semiconductor device; and a plurality of alloyed metal-semiconductor zones, each zone having a perimeter that is adjacent and abuts the reflective metal layer, formed from the reflective metal layer and the at least one of the top and bottom surfaces of the light emitting semiconductor device, the alloyed metal-semiconductor zones comprising by area no more than 10% of the total area of the reflective metal layer and the alloyed metal-semiconductor zones combined, the alloyed metal-semiconductor zones forming an ohmic, low resistance contact with the at least one of the the top and bottom surfaces of the light emitting semiconductor device.

2. The reflective contact of claim 1 wherein each of the alloyed metal-semiconductor zones has a shape, that shape being selected from a group of shapes comprising at least circles, ellipses, squares, and annular rings.

3. The reflective contact of the claim 1 wherein the alloyed metal-semiconductor zones are individually between $\pi/4$ to $625\pi\,\mu m^2$ in area and more than 2.8 $\mu$m apart.

4. The reflective contact of claim 1 wherein the alloyed metal-semiconductor zones are formed by means of a laser beam.

5. The reflective contact of claim 4 wherein the reflective metal layer further comprises a plurality of layers, the plurality of layers comprising:

a reflective metal layer; and a dopant metal layer.

6. The reflective contact of claim 4 wherein the area weighted reflectivity of the metal layer and alloyed metal-semiconductor zones is greater than 80%.

* * * * *